United States Patent
Li et al.

(10) Patent No.: US 11,962,333 B2
(45) Date of Patent: Apr. 16, 2024

(54) PREDICTING COMPRESSION RATIO OF DATA WITH COMPRESSIBLE DECISION

(71) Applicant: Hong Kong Applied Science and Technology Research Institute Company Limited, Hong Kong (HK)

(72) Inventors: Hailiang Li, Hong Kong (HK); Yan Huo, Hong Kong (HK); Tao Li, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 0 days.

(21) Appl. No.: 17/891,389

(22) Filed: Aug. 19, 2022

(65) Prior Publication Data

US 2024/0063813 A1    Feb. 22, 2024

(51) Int. Cl.
    *H03M 7/30*    (2006.01)
(52) U.S. Cl.
    CPC ..................... *H03M 7/30* (2013.01)
(58) Field of Classification Search
    CPC ............ H03M 7/30; H03M 7/3059; H03M 7/3068–3071; H03M 7/3075; H03M 7/3077–3079; H03M 7/42; H03M 7/6058–6064; H03M 7/6082; H03M 7/6094
    See application file for complete search history.

(56) References Cited

U.S. PATENT DOCUMENTS

| | | | |
|---|---|---|---|
| 9,509,336 B1 * | 11/2016 | Henry | H03M 7/30 |
| 9,564,918 B2 | 2/2017 | Asher et al. | |
| 9,606,750 B2 | 3/2017 | Seo et al. | |
| 10,097,202 B1 | 10/2018 | Ki et al. | |
| 2013/0007346 A1 * | 1/2013 | Khan | H03M 7/3071 711/E12.008 |
| 2019/0141167 A1 | 5/2019 | Nolan et al. | |
| 2021/0193076 A1 | 6/2021 | Morrell et al. | |

FOREIGN PATENT DOCUMENTS

CN    115843366 A  *  3/2023

OTHER PUBLICATIONS

ISR and Written Opinion, PCT/CN2022/118272, dated May 4, 2023.

* cited by examiner

*Primary Examiner* — Matthew D Sandifer
(74) *Attorney, Agent, or Firm* — Stuart T. Auvinen; gPatent LLC

(57) ABSTRACT

A data-compression analyzer can rapidly make a binary decision to compress or not compress an input data block or can use a slower neural network to predict the block's compression ratio with a regression model. A Concentration Value (CV) that is the sum of the squares of the frequencies and a Number of Zero (NZ) symbols are calculated from an un-sorted symbol frequency table. A rapid decision to compress is signaled when their product CV*NZ exceeds a horizontal threshold THH. During training, CV*NZ is plotted as a function of compression ratio C % for many training data blocks. Different test values of THH are applied to the plot to determine true and false positive rates that are plotted as a Receiver Operating Characteristic (ROC) curve. The point on the ROC curve having the largest Youden index is selected as the optimum THH for use in future binary decisions.

12 Claims, 15 Drawing Sheets

|  | ACTUAL | |
|---|---|---|
|  | POS. | NEG. |
| PREDICTED POS. | TRUE POS. | FALSE POS. |
| PREDICTED NEG. | FALSE NEG. | TRUE NEG. |

Horizontal Threshold (THH); Vertical Threshold (THV)

FIG. 6

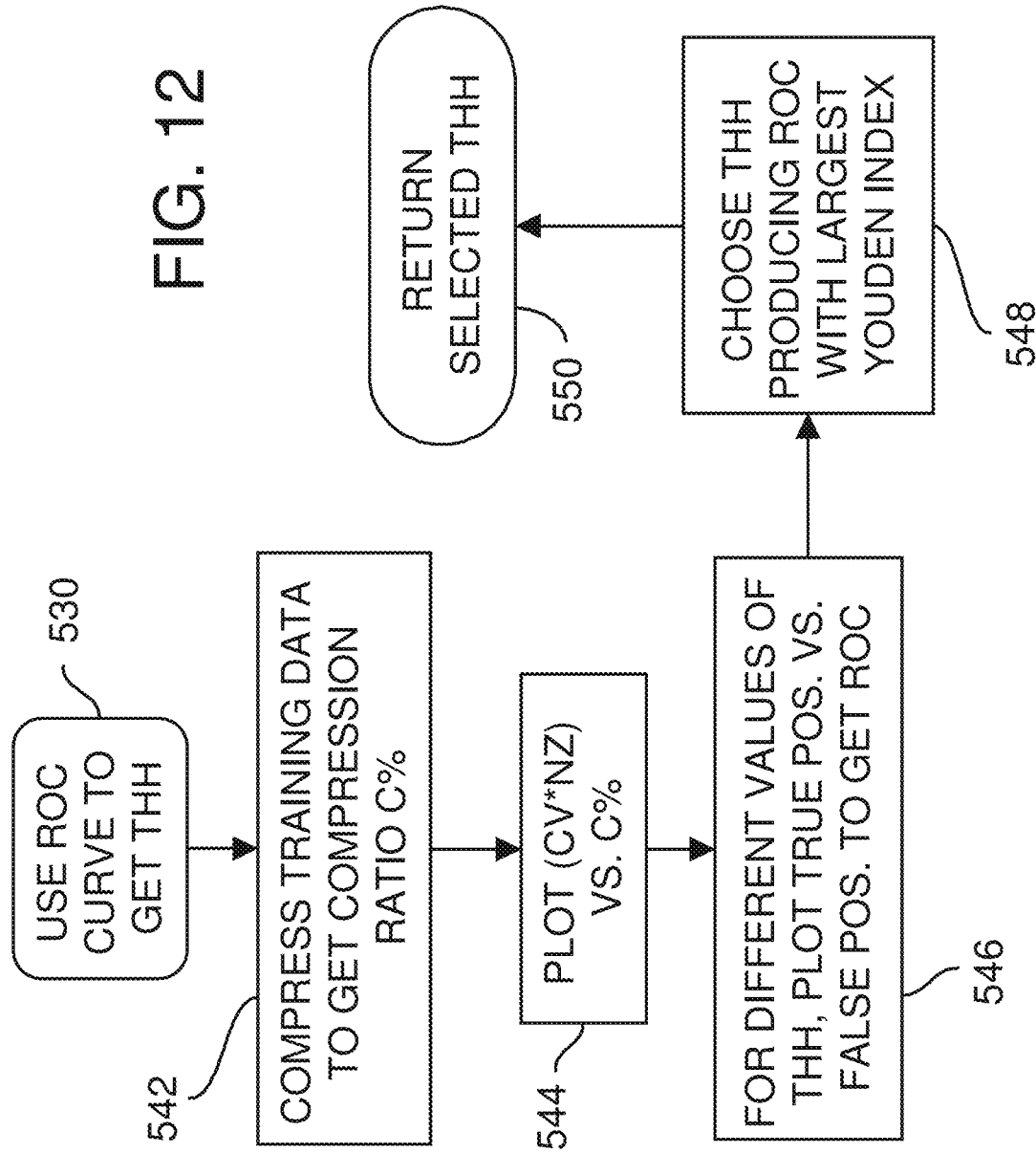

PREDICTING COMPRESSION RATIO OF DATA WITH COMPRESSIBLE DECISION

FIELD OF THE INVENTION

This invention relates to data compression, and more particularly to compression prediction and decision using neural networks.

BACKGROUND OF THE INVENTION

Neural Networks use weights for nodes within the network. The network topology and connectivity can be defined by a feature map. These weights and feature maps can be quite large for deep neural networks and convolutional neural networks.

Neural network weights and feature maps may be compressed before storage or transmission. FIG. 1 shows a neural network that has its weights and feature maps compressed before storage or transmission. Neural network 104 can be a Graphics Processing Unit (GPU) or a specialized neural network processor. Neural network 104 may have been trained and its weights and feature maps adjusted to be optimized for a particular problem or data set. These weights and feature maps may be backed up or stored in memory 102.

However, memory 102 may be remote from neural network 104, such as when neural network 104 is on a portable device and memory 102 is cloud storage. The connection between neural network 104 and memory 102 may be limited in bandwidth. Compressor 100 can compress the weights and feature maps from neural network 104 using lossless compression, and the compressed data can be sent to memory 102. The amount of memory required in memory 102 for storage can be reduced, as well as the bandwidth consumed for transmission.

Compressed weights and feature maps stored in memory 102 may be transmitted over network links to a local device that includes compressor 100, which decompresses the weights and feature maps and loads them into neural network 104 to configure neural network 104 for a specific processing task.

Some data may be so random or unstructured that it poorly compresses. It is better not to attempt compression of such data since the compressed data may be larger than the original data. The compression ratio of a data set can be predicted using Entropy and other methods. The predicted compression ratio can be used to reserve storage space in memory 102, and to decide when to compress or not compress data.

However, entropy-based compression-ratio prediction can be difficult to implement in hardware since a logarithmic operator is often needed for the entropy calculations. The predicted compression ratio can be very data-dependent.

In some applications, memory 102 may not reserve storage spaced based on the predicted compression ratio. Then the actual compression ratio is not really needed; only a decision to compress or not compress the data is really needed. The predicted compression ratio may be compared to a threshold to decide when to compress data, but the value of the predicted compression ratio is not really important other than in comparison to the threshold.

A more streamlined method to reach a compress/not compress decision is desired that does not involve calculating the predicted compression ratio. It is desired to use a neural network to make a compress/don't compress decision without predicting a compression ratio. In other applications that use a predicted compression ratio, it is desired to use a trained neural network to calculate the predicted compression ratio. A neural network that can both predict compression ratio or more quickly generate the compression decision is desirable. A compression predictor that does not use entropy calculations or logarithmic operators is desired.

BRIEF SUMMARY OF THE INVENTION

A data-compression analyzer has a counter for counting occurrences of symbols in an input data block to generate a symbol frequency table storing symbol frequencies for the input data block, and a calculator for calculating a Concentration Value (CV) of the input data block by summing squares of the symbol frequencies in the symbol frequency table, and a zero tracker having a Number of Zeros (NZ) that indicates a number of symbols in the input data block having a symbol value of zero, and a multiplier that multiplies the Concentration Value (CV) with the Number of Zeros (NZ) to get a CV*NZ product; and a comparator for comparing the CV*NZ product to a horizontal threshold and signaling that the input data block is compressible when the CV*NZ product exceeds the horizontal threshold, and signaling that the input data block is not compressible when the CV*NZ product is less than the horizontal threshold, whereby the CV*NZ product is compared to the horizontal threshold to signal that the input data block is compressible or not compressible. A zeros counter counts a number of symbols having a value of zero in the input data block to generate the Number of Zeros (NZ). The Number of Zeros (NZ) is obtained by reading an entry in the symbol frequency table for symbols having a symbols value of zero. A threshold optimizer has a trainer that applies a plurality of training data blocks to the counter, causing the calculator and multiplier to generate a plurality of CV*NZ products for the plurality of training data blocks. A compression ratio is received or generated for each training data block in the plurality of training data blocks. The compression ratio is for a training data block being a ratio of a size of the training data block after compression to a size of the training data block. A tabulator tabulates the plurality of CV*NZ products as a function of the compression ratio for each of the plurality of training data blocks. A Receiver Operating Characteristic (ROC) tabulator compares the plurality of CV*NZ products to the horizontal threshold to obtain predicted results, and compares the compression ratio for each training data block to a vertical threshold to obtain actual results, and generates true and false positive rates from the predicted and actual results. An ROC optimizer selects an optimal combination of the true and false positive rates and outputs a test value of the horizontal threshold corresponding to the optimal combination as the horizontal threshold for use by the comparator for input data blocks. A Youden index generator generates a plurality of Youden indexes, wherein each Youden index corresponds to a point on an ROC curve of the combination of the true and false positive rates. The ROC optimizer selects a Youden index having a maximum value to identify an optimal combination and the horizontal threshold generating the optimal combination.

BRIEF DESCRIPTION OF THE DRAWINGS

FIG. 6 shows a confusion matrix.

FIG. 12 is a flowchart of using a Receiver Operating Characteristic (ROC) curve to optimize the horizontal threshold THH.

DETAILED DESCRIPTION

The present invention relates to an improvement in compression-prediction neural networks. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
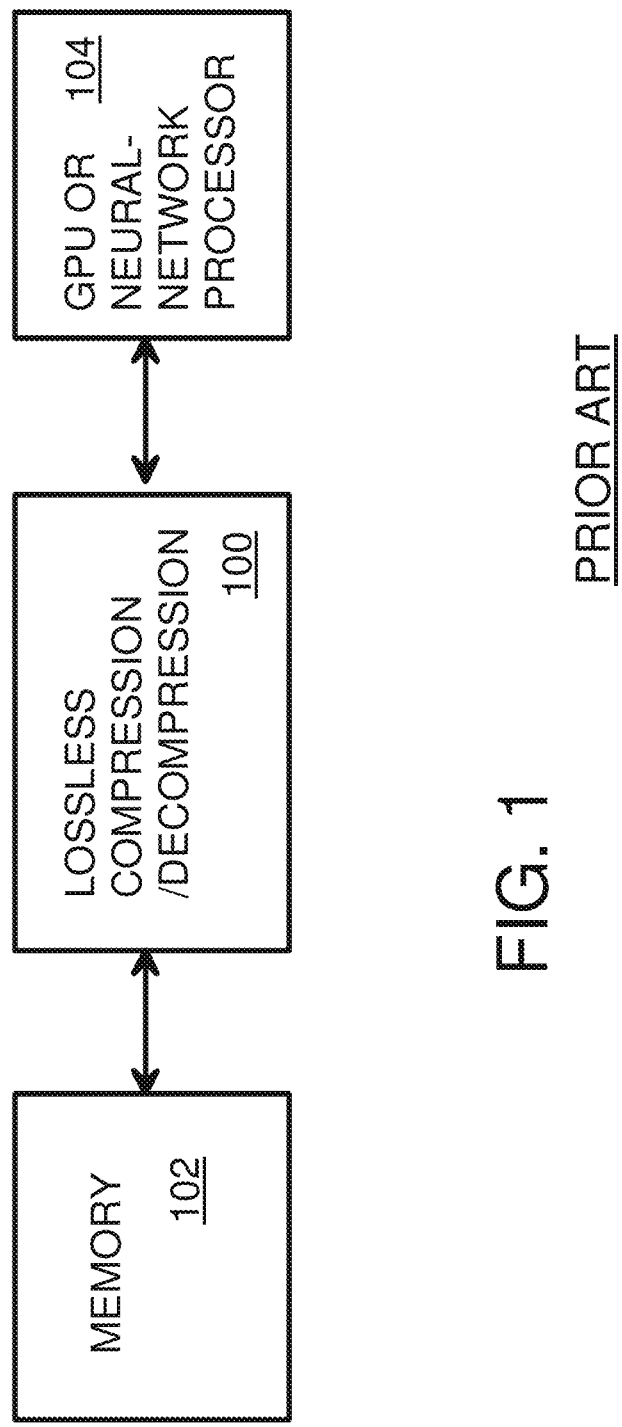
FIG. 1 shows a neural network that has its weights and feature maps compressed before storage or transmission.
Figure 2:
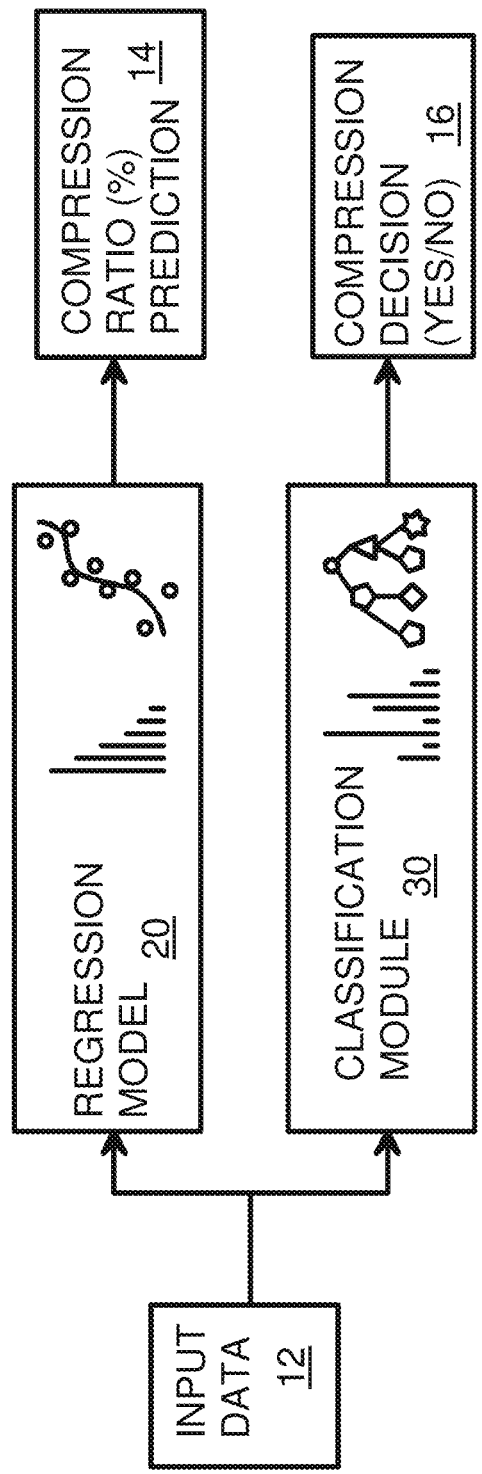
FIG. 2 is a block diagram of a compression-prediction neural network.

FIG. 2 is a block diagram of a compression-prediction neural network. Input data 12 may be one or more blocks of data that is to be transmitted over a limited-bandwidth network. It is desired to compress input data 12. When an estimate of the compressed data size is desired, such as to reserve bandwidth or memory space, input data 12 is sent to regression model 20 that is implemented on a neural network. Regression model 20 outputs compression ratio prediction 14. The compression ratio can be expressed as a percentage of the original file size, with 100% being an incompressible file, and lower percentages being more highly compressed files. For example, a 20% compression ratio indicates that the compressed file is only one-fifth of the size of the original data file.

When the predicted compression percentage is not needed, such as when bandwidth of memory is not being reserved based on the predicted compressed file size, then regression model 20 is not activated. Instead, input data 14 is sent to classification module 30. Classification module 30 is also implemented by a neural network. Classification module 30 classifies the input data as either compressible or not compressible. The binary decision may be easier and faster to obtain than the predicted compression ratio since there are only 2 possible outputs: yes or no. Classification module 30 outputs compression decision 16, which can be a single binary bit or Boolean value.

Figure 3:
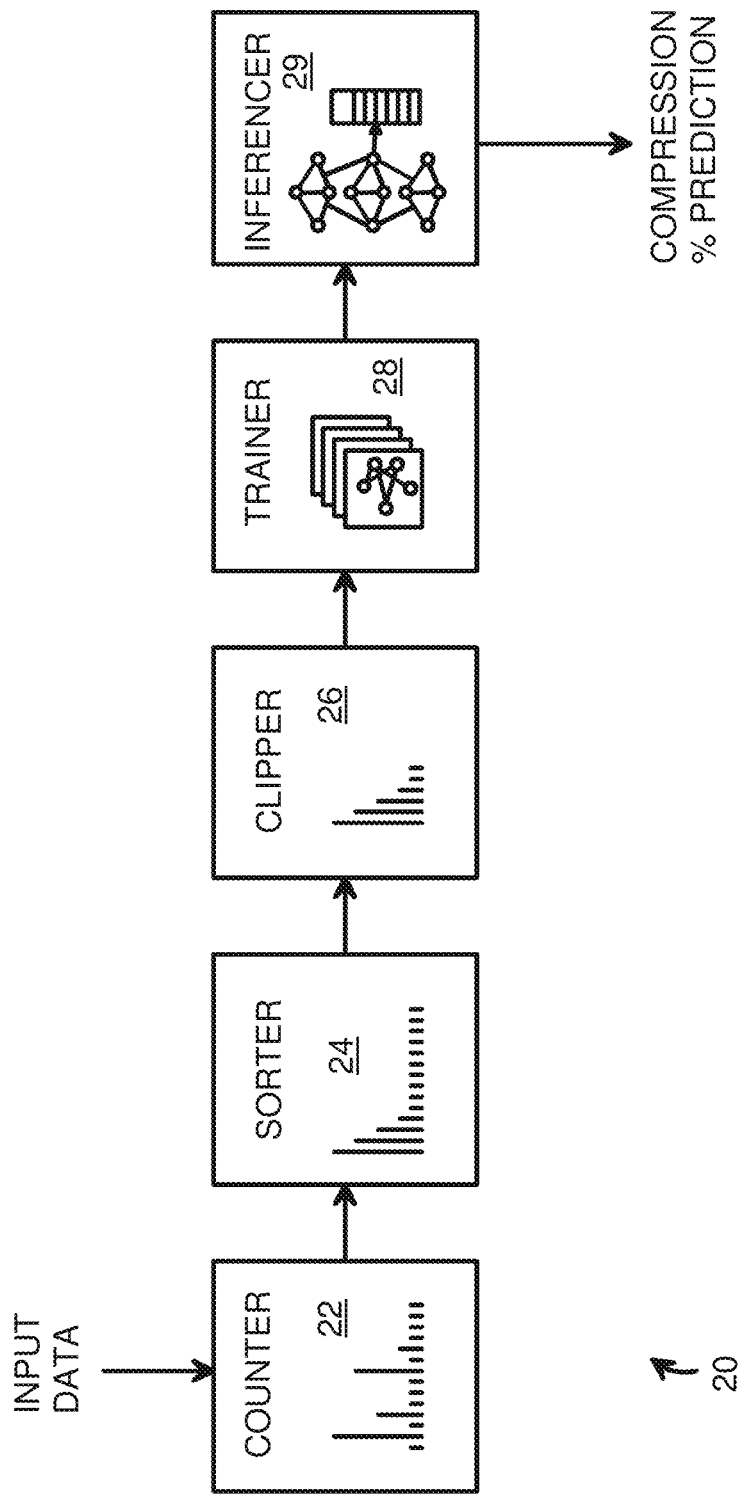
FIG. 3 shows the regression model in more detail.

FIG. 3 shows the regression model in more detail. The block of input data is applied to counter 22, which counts the number of symbols that occur in the input data for each possible symbol value to get a count or frequency for each symbol. A histogram or table such as a symbol frequency table may be generated by counter 22. This symbol frequency table is indexed by the symbol value (X) and is not sorted based on the frequency or count (Y), so frequency peaks can appear anywhere in the frequency table.

Sorter 24 then sorts the frequency counts from the symbol frequency table generated by counter 22 to obtain a sorted frequency table. The sorted frequency table has the symbol with the highest count or frequency in the left most position, followed by the symbol with the second highest count, then followed by the symbol with the third highest count, etc. Thus the frequency or count values decrease with the X axis or index in the sorted frequency table generated by sorter 24.

Clipper 26 deletes the symbol entries with the smallest count values from the sorted frequency table. For example, for 8-bit symbols that have symbol values from 1 to 256, the 128 symbols with the lowest frequency counts can be deleted by clipper 26. Only the 128 symbols with the highest occurrence or frequency are retained by clipper 26. Clipping reduces the data set size and allows for faster processing by the neural network.

The neural network implementing regression model 20 must first be trained using training data. The training data may include a large number of input data blocks that also have compression ratio data. For example, each of the training input data blocks could be compressed to determine the compression ratio, or another prediction calculator could be used to generate the compression ratios for the training data.

Trainer 28 can be a neural network that is configured for linear regression. The training input data sets with their compression ratio values are input to trainer 28. The weights in the neural network and its feature map are adjusted as more training sets are processes by trainer 28 until a training endpoint or convergence is reached.

After trainer 28 has processed the training data and has reached the endpoint, the final weights are applied to the neural network to configure it for compression prediction. The trained neural network acts as inferencer 29, using the neural network with the trained weights to generate a compression prediction for each input data block. During training, counter 22, sorter 24, clipper 26 and trainer 28 are used to adjust the neural network weights as training data is processed. Then during normal processing, counter 22, sorter 24, clipper 26 and inference 29 are used to generate the predicted compression ratio. The same neural network is used for both trainer 28 and inference 29. The weights are fixed when operating as inference 29 but are being adjusted during training when operating as trainer 28.

Figure 4:
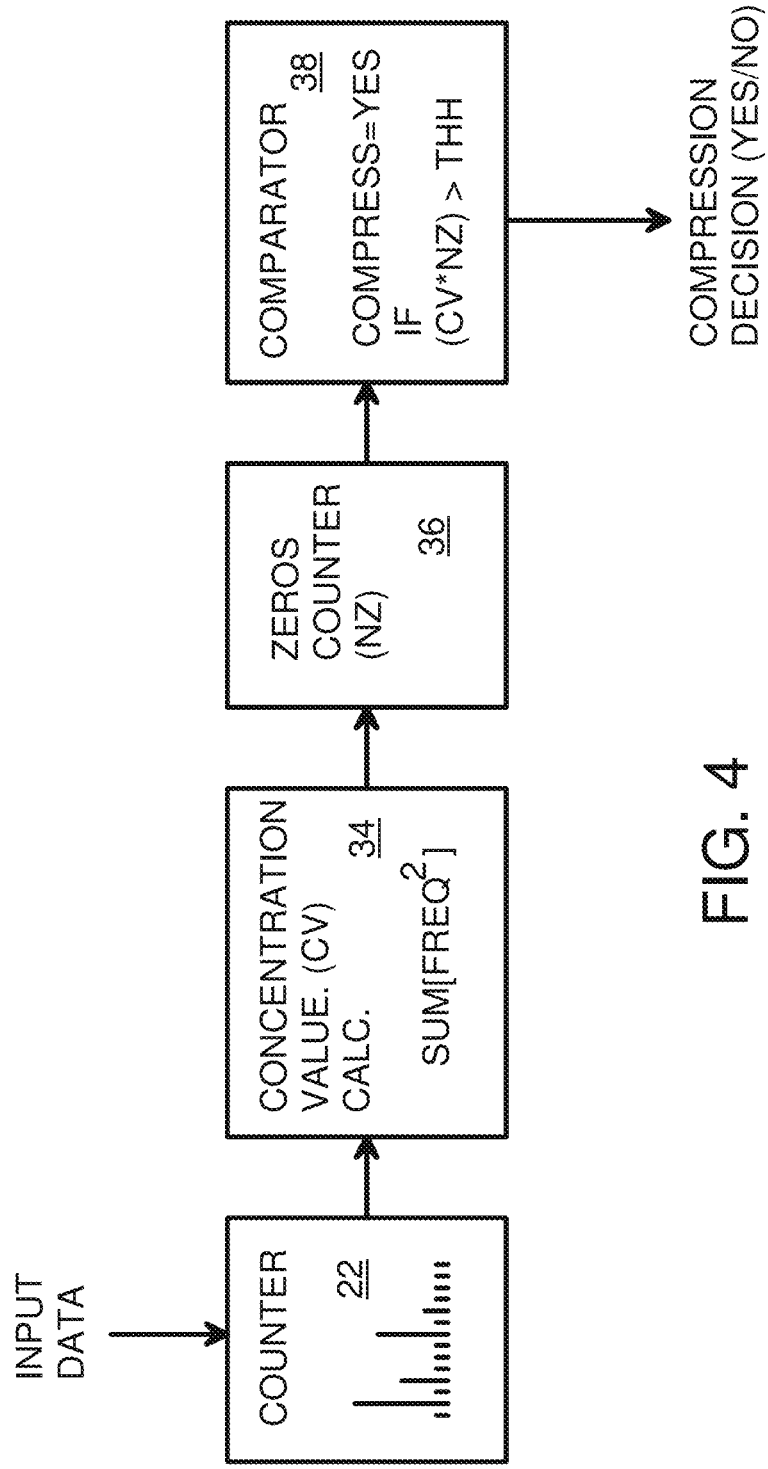
FIG. 4 shows the classification module in more detail.

FIG. 4 shows the classification module in more detail. Counter 22 generates the frequency counts for each symbol value and can be the same module as used by regression model 20. Counter 22 can be shared by regression model 20 and classification module 30.

Sorting by sorter 24 (FIG. 3) is time consuming and computation-intensive and thus increases the computational latency. The inventors have realized that sorting is not needed for the binary compressible decision, allowing for a faster decision than when predicting the compression ratio.

Concentration-value calculator 34 calculates the concentration value for the block of input data by squaring each frequency count, and then summing all the squared frequency counts. For an 8-bit symbol k with symbol values of 0 to 255, and frequency count frequency[k], the Concentration Value (CV) can be expressed as:

$$\text{concentration} = \sum_{k=0}^{255} \text{frequency}[k]^2$$

A single Concentration Value (CV) can be obtained for each data block by concentration-value calculator 34.

The number of zero-value symbols in the input data block is counted by zeros counter 36. The count is the same as the frequency count that counter 22 generated for the symbol having a value of zero, so zeros counter 36 can simply lookup the symbol value 0 in the symbol frequency table generated by counter 22 to get the Number of Zeros (NZ). Alternately, zeros counter 36 could scan the input data block and generate a new count of the number of zero-value symbols in the input data block.

The inventors realize that many compressible data blocks contain a large number of zero symbols or have a high concentration of other symbols. Non-compressible blocks often have few zero symbols and lack concentration of other symbols, so they will have low CV and NZ values. The inventors combine CV and NZ by multiplication to use as an input to a threshold comparator.

Comparator 38 compares the product CV*NZ to a threshold THH to decide when the input data block is compressible or not compressible. The simple yes/no decision made by comparator 38 is rapid and easy to implement. However, the usefulness and accuracy of the decision is very dependent on the threshold value THH.

Figure 5:
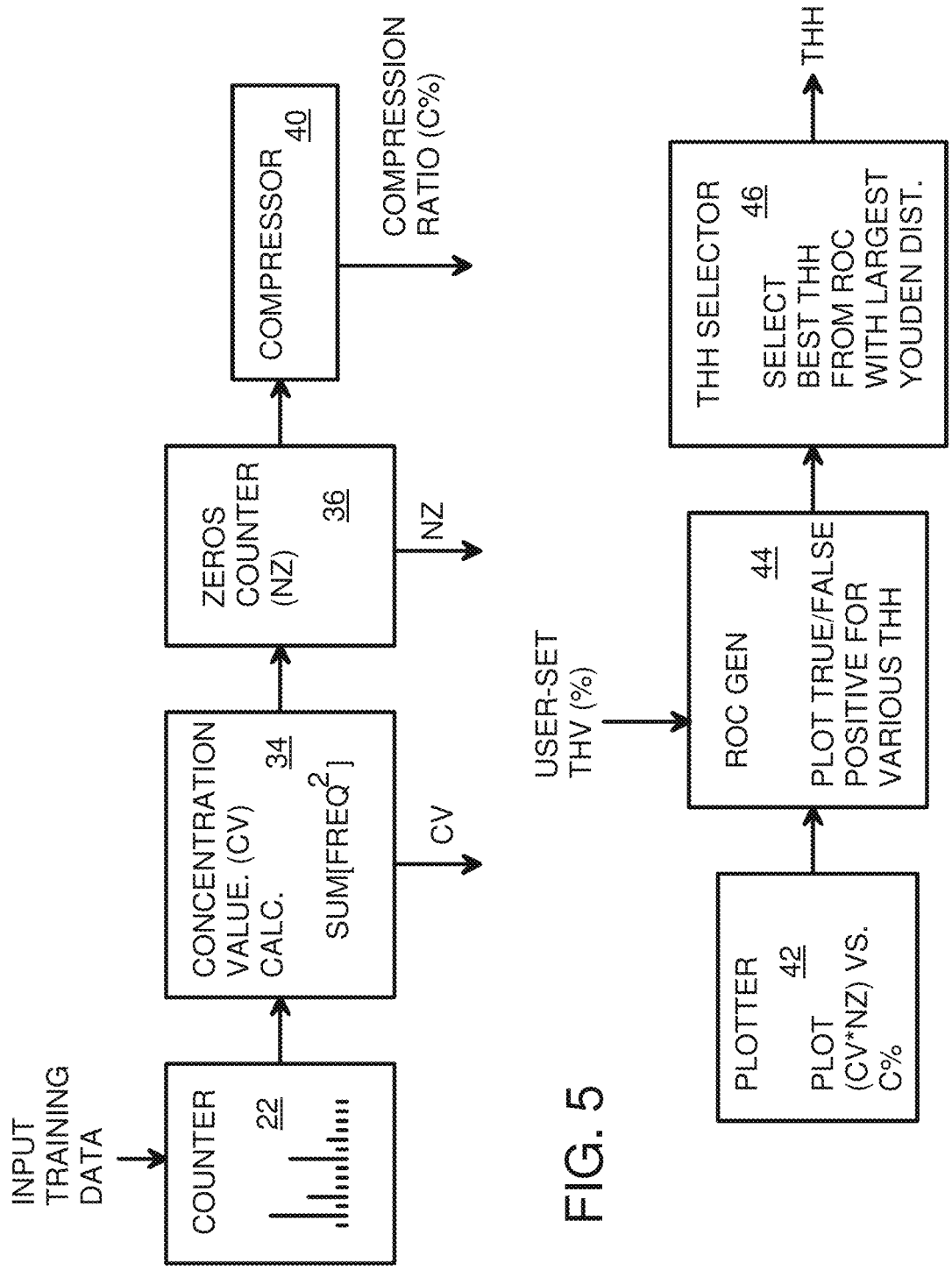
FIG. 5 is a diagram of the classification module using a Receiver Operating Characteristic (ROC) curve to set the compressible decision threshold.

FIG. 5 is a diagram of the classification module using a Receiver Operating Characteristic (ROC) curve to set the compressible decision threshold. During training, training input data is applied to counter 22, and concentration-value calculator 34 calculates the Concentration Value (CV) while zeros counter 36 finds the Number of Zeros (NZ) (occurrence of symbols with zero value) for each training block of data.

Figure 9:
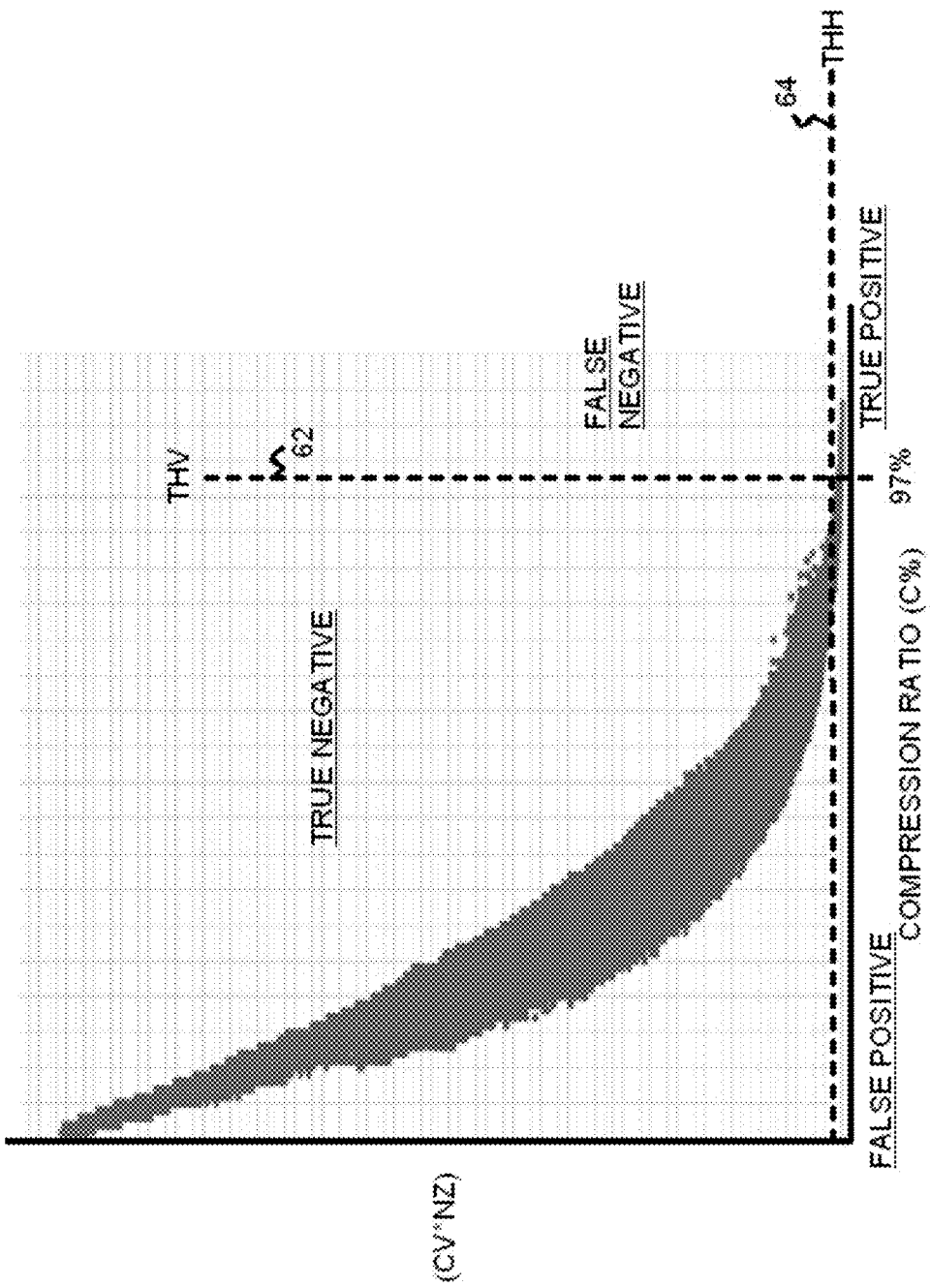
FIG. 9 is a graph of training data with prediction based on Concentration Value (CV) multiplied by Number of Zeros (NZ).

Plotter 42 plots or forms a table of the product CV*NZ as a function of the compression ratio C % from compressor 40. FIG. 9 is an example of a plot generated by plotter 42, where each data point is for a different training data set. The user sets a vertical threshold THV that is a compression ratio % that is considered the compressible limit. THV is somewhat arbitrary, and can be set to a value such a 95% and later adjusted.

Figures 14A, 14B:
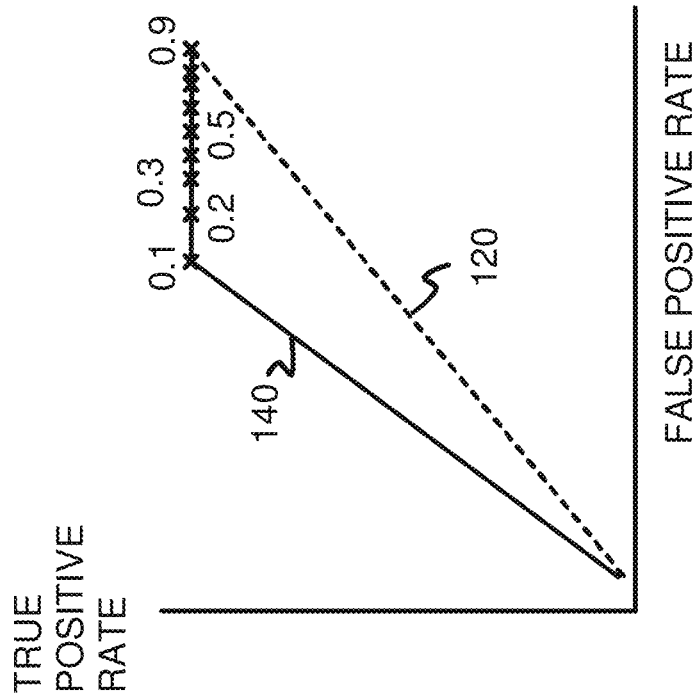
FIGS. 14A-14B highlight generating the ROC curve and selecting the optimal THH with the largest Youden index.

A Receiver Operating Characteristic (ROC) curve is generated by ROC generator 44. ROC generator 44 tests various values of the horizontal threshold THH. ROC generator 44 obtains and plots the true positive rate as a function of the false positive rate for the different values of THH that are tested. As an example, FIG. 14A is a table and FIG. 14B is plot of a ROC curve that could be generated by ROC generator 44.

Figure 13:
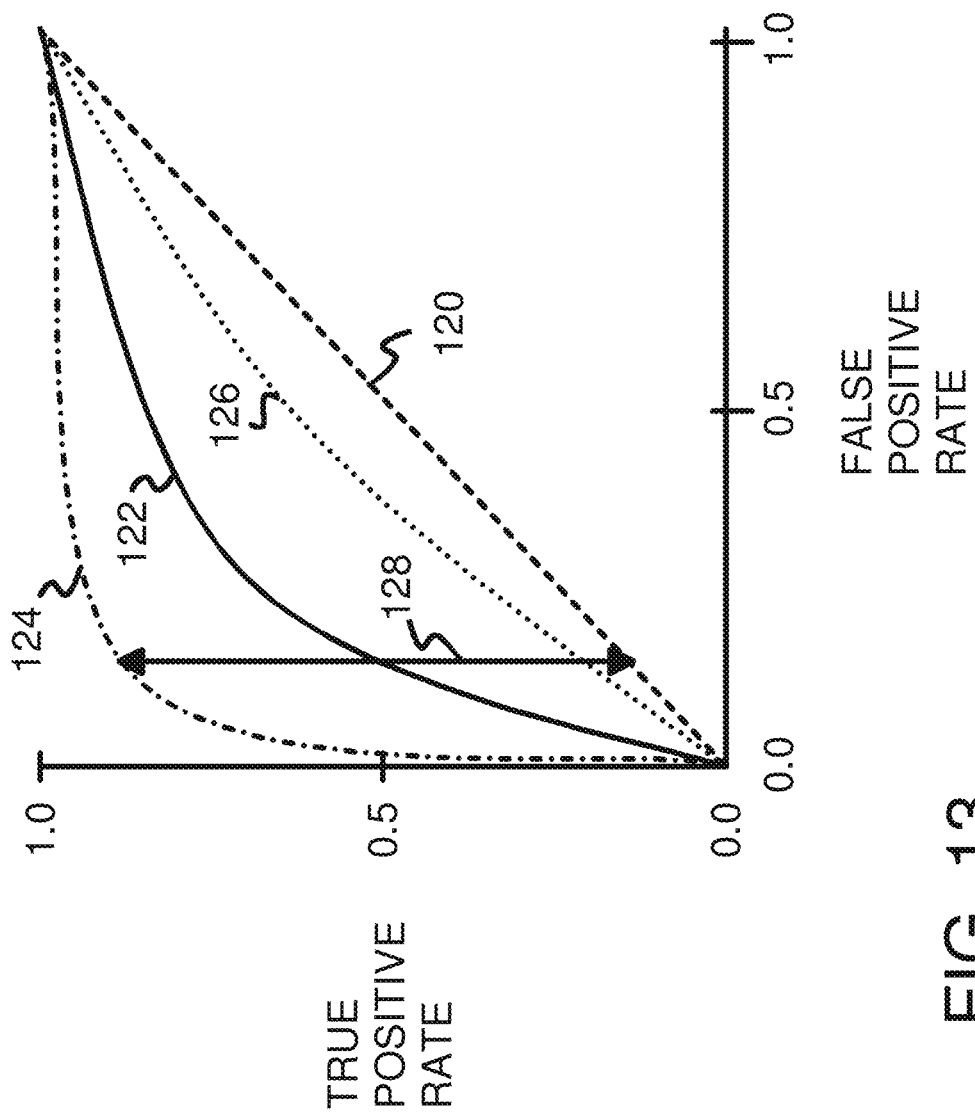
FIG. 13 is a plot of several Receiver Operating Characteristic (ROC) curves.

THH selector 46 examines the ROC plot or table generated by ROC generator 44 and selects the THH value that produces a point along the ROC curve that has the maximum Youden index. The Youden index can be expressed as a distance of a vertical line between the diagonal and the ROC curve, as shown in FIG. 13. The Youden index optimizes the differentiating ability of THH, giving equal weight to sensitivity and specificity.

Thus the horizontal threshold THH, is obtained by ROC generator 44 and THH selector from the CV*NZ and C % data from the training data set.

The units of the vertical and horizontal threshold are different. The vertical threshold THV is a compression percentage C %, while the horizontal threshold THH is a value of CV*NZ. THH is used to quickly make a compression decision, while THV is used during training to obtain an optimal value of THH that can be used in runtime.

FIG. 6 shows a confusion matrix. A confusion matrix is useful for evaluating a binary classification model, such as used by classification module 30 (FIG. 2). Training data is applied to the apparatus of FIG. 5 to plot CV*NZ vs. C % and then a range of values of THH are applied with a fixed value of VTH to evaluate the effectiveness of the thresholds.

The vertical threshold THV is set as a benchmark for judging true positive and negative samples. The horizontal threshold THH is a dividing line between positive and negative samples judged by one method. That means there are true positives and negatives, as well as detected positives and negatives. Therefore, there will be four groups: True Positive (TP), False Positive (FP), False Negative (FN), and True Negative (TN).

To get the optimal horizontal threshold THH for one dataset, the inventors plot the ROC curves based on the values from a confusion matrix. The optimal horizontal threshold THH is the upper-left point from all the ROC curves. The optimal C % comes the optimal horizontal threshold.

The vertical threshold THV is expressed as a compression % and separates actual positive and negative results. The horizontal threshold THH is expressed as a CV*NZ value rather than as a compression %. The predicted value can be positive or negative. Positive refers to not compressible while negative refers to compressible.

The prediction can be correct or incorrect. A True Positive (TP) occurs when the prediction is positive (not compressible) and the compression % is greater than the vertical threshold, C %>THV. A True Negative (TN) occurs when the prediction is negative (compressible) and the compression % is less than the vertical threshold, C %<THV. The compression decision was correct for both TP and TN cases.

Incorrect prediction occurs for the False Positive (FP) and False Negative (FN) cases. False Positive (FP) occurs when the prediction is positive (not compressible) but C %<THV, so the file really was compressible (negative), or below the vertical threshold of compression set by the user. False Negative (FN) occurs when the prediction is negative (compressible) but C %>THV, so the file really was not compressible (positive), above the vertical threshold.

The vertical and horizontal thresholds THV, THH, can be shifted or adjusted to improve the prediction outcomes and reduce false positive or false negatives. For example, shifting the vertical threshold VTH to the right will increase the true positives (TP) and reduce the false positives (FP), but the true negatives (TN) will also decrease while false negatives (FN) increase.

Figure 7:
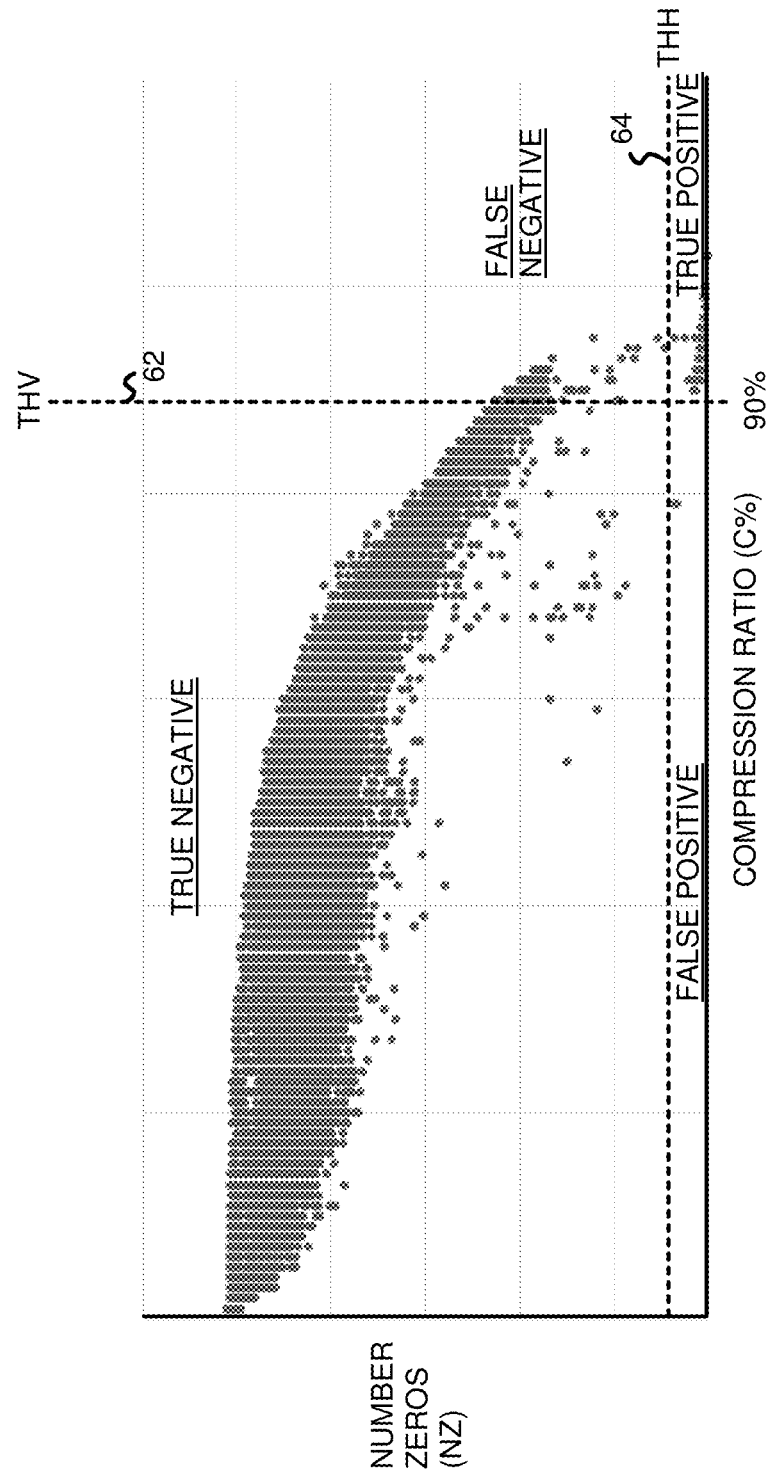
FIG. 7 is a graph of training data with prediction based on the Number of Zeros (NZ).

FIG. 7 is a graph of training data with prediction based on the Number of Zeros (NZ). NZ is useful for compression prediction.

Each point in the graph represents a different data block. When vertical threshold THV 62 is set to 90%, horizontal threshold THH 64 can be set at a low value to provide a large number of true negatives, or compressible files with correct prediction. This low THH 64 also captures several true positives, or data sets that are correctly predicted as not compressible.

However, some false negatives are found in the upper-right quadrant of THV 62 and THH 64. These are non-compressible files that are incorrectly predicted as compressible. Very few false positives occur in the lower left quadrant. While using NZ alone for the horizontal threshold is useful, there are still too many false negatives.

Figure 8:
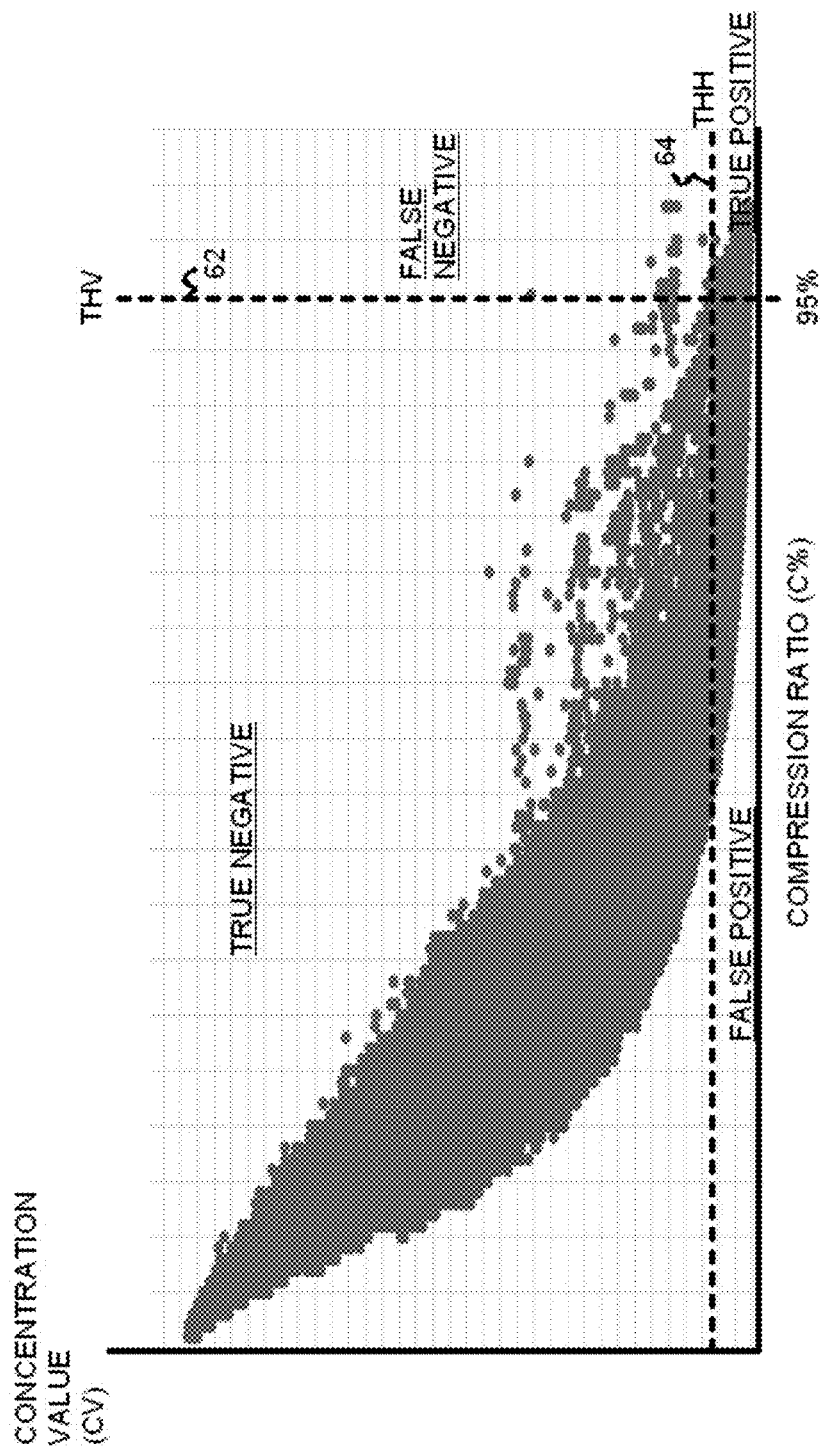
FIG. 8 is a graph of training data with prediction based on the Concentration Value (CV).

FIG. 8 is a graph of training data with prediction based on the Concentration Value (CV). CV is also useful for compression prediction. When vertical threshold THV 62 is set to 90%, horizontal threshold THH 64 can be set at a low value to provide a large number of true negatives, or compressible files with correct prediction. This low THH 64 also captures many true positives, or data sets that are correctly predicted as not compressible.

However, a significant number of false positives occur because the data tens to curve downward more than for NZ (FIG. 7). THH 64 would have to be set to a very low level to remove these false positives. Then true positives would also decrease while false negatives increase. Using CV alone for setting the horizontal threshold would produce too many false positives.

FIG. 9 is a graph of training data with prediction based on Concentration Value (CV) multiplied by Number of Zeros (NZ). The value of CV*NZ is plotted on the Y axis for each training data block as a function of the compression ratio C % for that block. The plot of the product CV*NZ is much steeper and better suited than that for CV or NZ separately (FIGS. 7-8). This steeper plot provides for better distinguishing of prediction results.

Vertical threshold THV 62 can be set to a higher value, such a 97%. This allows for more files to be compressed. True negatives are increased. Horizontal threshold THH 64 can be set to a low value to reduce false positives while still identifying true positives (non-compressible files).

Figure 10:
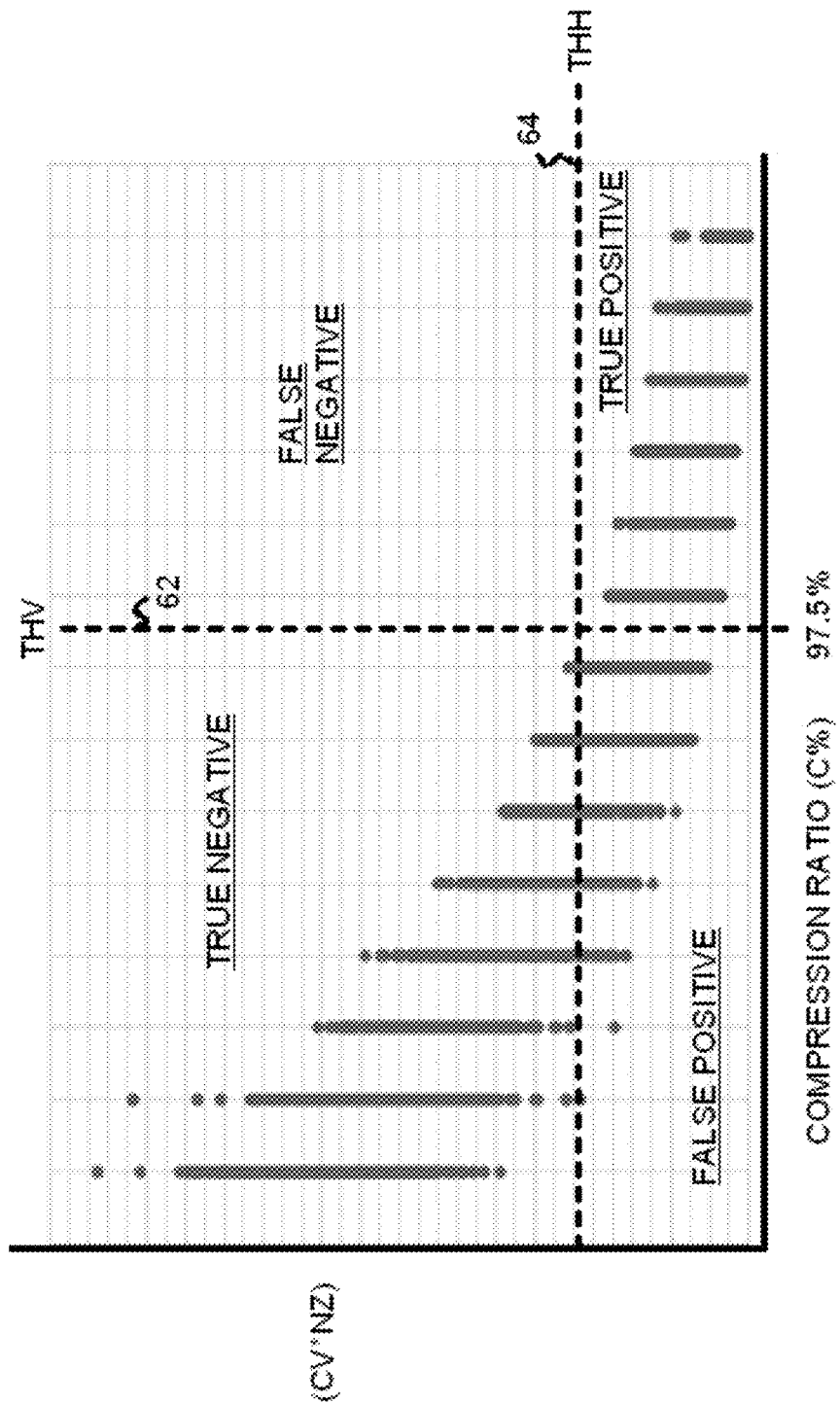
FIG. 10 is an enlargement of the graph of FIG. 9.

FIG. 10 is an enlargement of the graph of FIG. 9. FIG. 10 zooms in on the region around the intersection of vertical threshold THV 62 and horizontal threshold THH 64. False negatives are almost eliminated by adjusting THV to 97.5%. There are still some false positives, but there are more true positives.

Figure 11A:
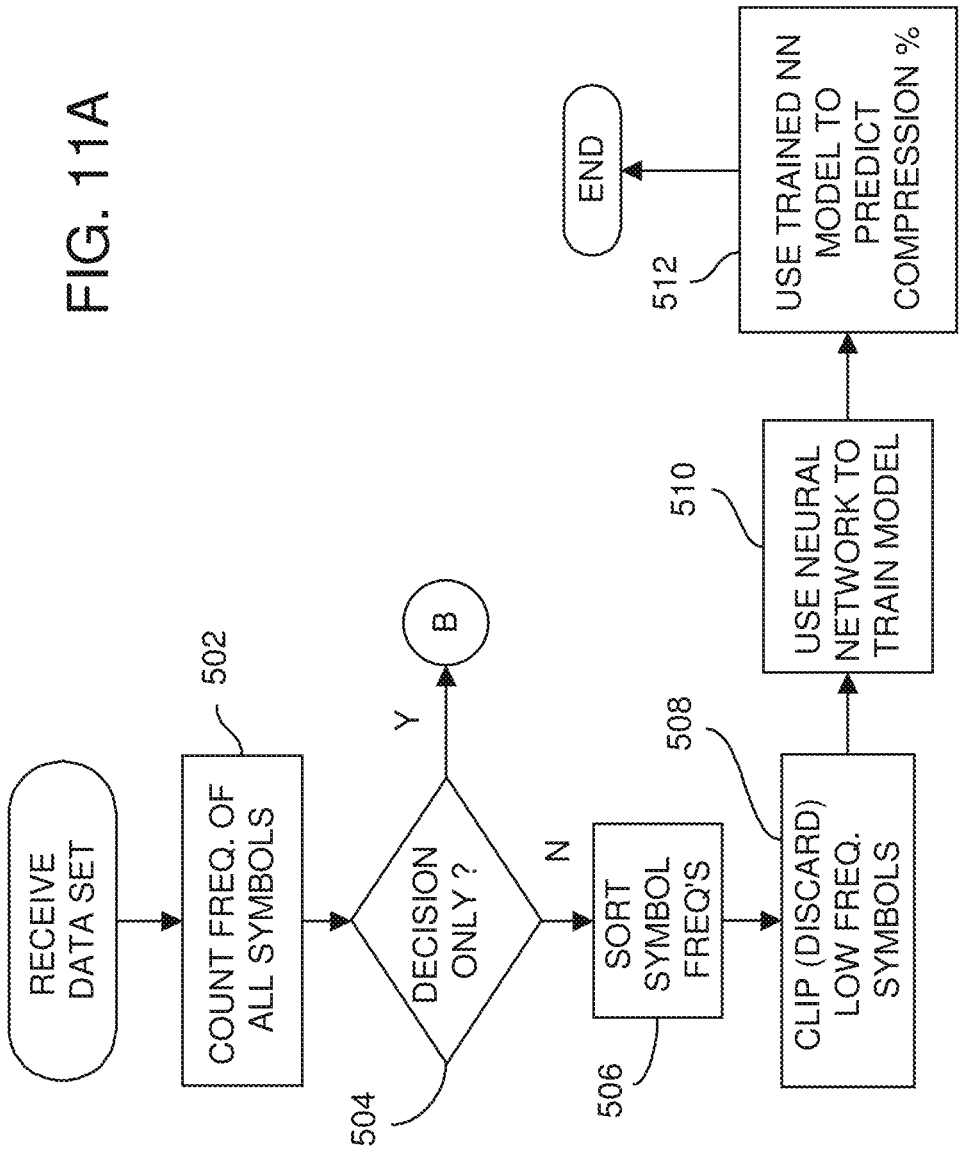
FIGS. 11A-11B show a flowchart of operation of a neural network for compression prediction and decision.
Figure 11B:
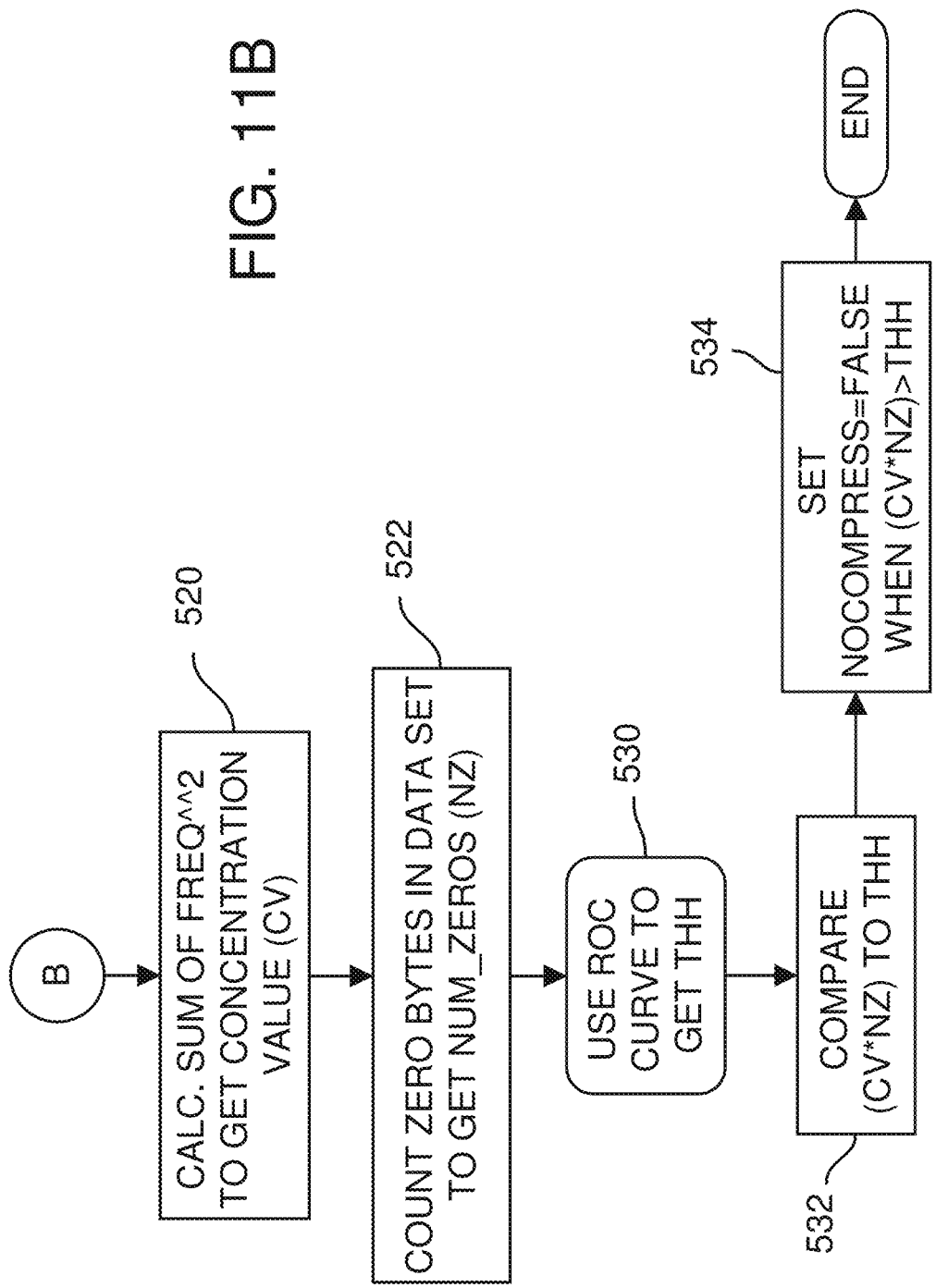

FIGS. 11A-11B show a flowchart of operation of a neural network for compression prediction and decision. In FIG. 11A, a data set of symbols is received and the frequency of all symbols counted, step 502. When only a compression decision is needed, step 504, then the process continues in FIG. 11B. When a compression prediction is desired rather than a decision, step 504, then the symbol frequencies are sorted, step 506. Sorting is not required when only a decision is required, FIG. 11B, allowing a compression decision to be made more quickly.

Continuing in FIG. 11A, the low-frequency symbols are clipped and discarded, step 508, resulting in a smaller data set of sorted symbol frequencies. Subsequent processing may be reduced because of the smaller data set.

The neural network is trained using training data, step 510, to obtain trained weights. Then the trained weights are used by the neural network to generate a prediction for the compression ratio of the input data set, step 512. Step 510 can be repeatedly performed on many training data sets that are sorted and clipped by steps 502, 506, 508 before actual data sets are processed by step 512.

In FIG. 11B, only a compression decision is needed; the compression ratio prediction is not needed. The symbol frequencies are not sorted but are used to calculate the Concentration Value (CV), step 520, and the Number of Zeros (NZ), step 522 of the unsorted input data set.

The horizontal threshold THH has previously been obtained using ROC process 530 of FIG. 12. The product of CV and NZ, (CV*NZ), is compared to horizontal threshold THH, step 532. When CV*NZ is greater than THH, step 534, then the file is compressible and the NOCOMPRESS flag is set to false.

FIG. 12 is a flowchart of using a Receiver Operating Characteristic (ROC) curve to optimize the horizontal threshold THH. ROC process 530 is executed during training before real-time input data sets are processed. Each training data block is compressed, step 542, to obtain the actual compression ratio C %. CV and NZ for each data block are obtained, such as by steps 520, 522 of FIG. 11B. Then the product CV*NZ is plotted or tabulated as a function of C %, step 544.

Points on the ROC curve are generated, step 546, for different test values of THH by determining when each training data block is a true positive or a false positive. An optimum value of THH is selected, step 548, by calculating the Youden index for each of the test values of THH and selecting the test value of THH having the largest Youden index. The THH selected with the largest Youden index is returned, step 550. During runtime processing, a compression decision can be quickly made by comparing the selected THH with the product CV*NZ.

FIG. 13 is a plot of several Receiver Operating Characteristic (ROC) curves. Many training data blocks are processed and each data block's CV*NZ is plotted or tabulated as a function of C %. A graph such as FIG. 9 is obtained, with each point representing a different data block in the training data. Vertical threshold THV is set to a user-defined value, such as 95%. However, the horizontal threshold THH is shifted up and down in the graph over a range of THH values. As horizontal threshold THH 64 is shifted upward, more data points are classified as false positives, but there also may be more true positives. Shifting horizontal threshold THH 64 downward will increase true negatives and decrease false positives and true positives.

These different rates of true positives and false positives are plotted or tabulated for the range of THH values to form ROC curve 122. Each ROC curve represents the diagnostic capacity of a binary classifier system. A random classifier produces diagonal line 120. In general, ROC curves that are farther from diagonal line 120 represent better classifiers. Thus ROC curve 124 is a better classifier than ROC curve 122, and ROC curve 126 is inferior to ROC curves 124, 122.

All of the training data blocks will generate points along only one of the ROC curves for any particular neural network classifier system. For example, when the neural network produces points along ROC curve 124 for different test values of THH, the optimal value of THH can be found as the point along ROC curve 124 that is farthest from diagonal line 120. This optimization can be found by finding the Youden index for each THH test value, or for each point along ROC curve 124. The point with the largest Youden index is the optimal value of THH.

In this example, Youden index 128 is the largest value for ROC curve 124. Youden index 128 points to the point on ROC curve 124 that has the optimum value of THH.

FIGS. 14A-14B highlight generating the ROC curve and selecting the optimal THH with the largest Youden index. In this example vertical threshold THV is set to 95% as files are considered compressible if they are at least 5% smaller when compressed.

In FIG. 14A, many training data blocks have been processed to generate a table of CV*NZ values as a function of C %, and the number of True Positive (TP) points, False Positive (FP) points, True Negative (TN) points, False Negative (FN) points have been counted and tabulated in FIG. 14A for various test values of THH. The test values of THH range from 0.0 to 1.0. As seen in the table of FIG. 14A, as THH increases, FP increases while TN decreases.

The true positive rate is calculated from the TP and FN values in FIG. 14A as:

TPR=TP/(TP+FN)

TPR is also known as the recall. The false positive rate is calculated from FP and TN values in the table of FIG. 14A as:

FPR=FP/(FP+TN)

The calculated TPR is plotted as a function of FPR to obtain the plot in FIG. 14B. Each THH value in the table corresponds to one point in ROC curve 140 of FIG. 14B. The point on ROC curve 140 with the largest distance to diagonal line 120 has be largest Youden index and is the optimal point. The point with a THH value of 0.1 is this optimal point, since it is farther from diagonal line 120 that points for THH values of 0.2, 0.3, 0.5, 0.9. etc. The actual Youden index for each point of ROC curve 140 could be calculated as the vertical distance to diagonal line 120. Then the highest Youden index could be selected, and its corresponding THH output as the optimized THH.

ALTERNATE EMBODIMENTS

Several other embodiments are contemplated by the inventors. Compressor 40 could determine the compression ratio (C %) for each training data block, such as by compressing the data and comparing file sizes before and after compression, or by using a compression ratio algorithm without actually compressing the data. Alternately, C % could be provided with the input training data so that compressor 40 is not needed.

While graphs and plots have been shown and described for better understanding by a human reader, a computer system may use a table or other data structure to implement these plots or graphs. A table can be a computer-implemented plot.

While an optimal Horizontal threshold THH has been described as being found by the point with the largest Youden index in the ROC curve, a sub-optimal Horizontal threshold THH could also be used, such as from the ROC curve point with the second largest Youden index. Some applications make permit sub-optimal thresholds. Horizontal threshold THH could also be set once, such as at initialization or at the factory during manufacture, and kept constant for all future data sets, although re-calibrating horizontal threshold THH for new data sets could produce better compression decisions. Horizontal threshold THH could also be set empirically or by the user.

Various parameters may be expressed in a variety of ways and variations. For example, the compression ratio could be defined to be 100% for a non-compressible file and be 20% for a file that is 80% smaller when compresses, or could be defined to be 20% for a file that is only 20% smaller when compressed. Other statistics could likewise be altered, redefined, shifted, transformed, etc.

The ROC curve may be generated with different X and Y axis definitions. The true positive rate and the false positive rate could be change to other definitions. The optimal point on these substitute ROC curves could be obtained by other methods similar to the Youden index, such as graphical methods.

The Number of Zeros (NZ) could be tracked by using a zero counter, a memory such as a semiconductor or disk memory, an input, or read from a symbol frequency table. NZ could be stored in the zero counter, in a memory, table, register, or processing unit and could be stored in more than one location.

Various block sizes and symbol sizes could be used. The block size could be fixed or variable. An 8-bit symbol and an 8-byte block are just one of many possibilities. Symbol values may be encoded as binary, two's complement, or in other encoding codes.

Some embodiments may not use all components. Additional components may be added. A loss function for converging during training may use various error/loss and cost generators, such as a weight decay term that prevents weights from growing too large over many cycles of training optimization, a sparsity penalty that encourages nodes to zero their weights, so that only a small fraction of total nodes is used. Many substitutions, combinations, and variations are possible. Other variations and kinds of loss or cost terms can be added to loss function. The values of the relative scaling factors for the different cost functions can be adjusted to balance the impact of the various functions. The training endpoint for the neural network may be set for various combinations of conditions, such as a desired final accuracy, an accuracy-hardware cost product, a target hardware cost, etc.

The neural network, loss function, and other components may be implemented in a variety of technologies, using various combinations of software, hardware, firmware, routines, modules, functions, etc. The final result may be derived from the neural network with the final weights, and might be implemented as a program module, or in an Application-Specific Integrated Circuit (ASIC) or other hardware to increase processing speed and lower power consumption.

Terms such as left, right, up, down, are relative and can be flipped, rotated, transformed, or transposed in various ways. Adders may add complement values to implement subtraction. Subtraction and addition thus can be used interchangeably.

Various interleaving and mapping schemes could alter the actual storage locations to optimize bandwidth or other design parameters. Many memory arrangements, both physical and logical, are possible. Various parallel processing techniques may be used that perform the basic operations described here in a serial fashion for easier understanding.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A data-compression analyzer comprising a processor or an Application-Specific Integrated Circuit (ASIC) which comprises:
    a counter for counting occurrences of symbols in an input data block to generate a symbol frequency table storing symbol frequencies for the input data block, wherein the symbol frequency table is stored in a computer memory;
    a calculator for calculating a Concentration Value (CV) of the input data block by summing squares of the symbol frequencies in the symbol frequency table;
    a zero tracker having a Number of Zeros (NZ) that indicates a number of symbols in the input data block having a symbol value of zero;
    a multiplier that multiplies the Concentration Value (CV) with the Number of Zeros (NZ) to get a CV*NZ product; and
    a comparator for comparing the CV*NZ product to a horizontal threshold and signaling that the input data block is compressible when the CV*NZ product exceeds the horizontal threshold, and signaling that the input data block is not compressible when the CV*NZ product is less than the horizontal threshold,
    whereby the CV*NZ product is compared to the horizontal threshold to signal that the input data block is compressible or not compressible.

2. The data-compression analyzer of claim 1 further comprising;
    a zeros counter that counts a number of symbols having a value of zero in the input data block to generate the Number of Zeros (NZ).

3. The data-compression analyzer of claim 1 wherein the Number of Zeros (NZ) is obtained by reading an entry in the symbol frequency table for symbols having a symbols value of zero.

4. The data-compression analyzer of claim 1 further comprising;
    a threshold optimizer comprising:
    a trainer that applies a plurality of training data blocks to the counter, causing the calculator and multiplier to generate a plurality of CV*NZ products for the plurality of training data blocks;
    wherein a compression ratio is received or generated for each training data block in the plurality of training data blocks, the compression ratio for a training data block being a ratio of a size of the training data block after compression to a size of the training data block;
    a tabulator that tabulates the plurality of CV*NZ products as a function of the compression ratio for each of the plurality of training data blocks;
    a Receiver Operating Characteristic (ROC) tabulator that compares the plurality of CV*NZ products to the horizontal threshold to obtain predicted results, and compares the compression ratio for each training data block to a vertical threshold to obtain actual results, and generates true and false positive rates from the predicted and actual results;
    an ROC optimizer that selects an optimal combination of the true and false positive rates and outputs a test value of the horizontal threshold corresponding to the optimal combination as the horizontal threshold for use by the comparator for input data blocks.

5. The data-compression analyzer of claim 4 further comprising;
    a Youden index generator that generates a plurality of Youden indexes, wherein each Youden index corresponds to a point on an ROC curve of the combination of the true and false positive rates,
    wherein the ROC optimizer selects a Youden index having a maximum value to identify an optimal combination and the horizontal threshold generating the optimal combination.

6. The data-compression analyzer of claim 4 wherein the ROC tabulator receives a vertical threshold that indicates a compression ratio, wherein training data blocks with the compression ratio greater than the vertical threshold are considered to be non-compressible, and wherein training data blocks with the compression ratio less than the vertical threshold are considered to be compressible;
    the ROC tabulator testing a plurality of test values of the horizontal threshold, the test values of the horizontal threshold being compared to the plurality of CV*NZ products, wherein a training data block having a CV*NZ product that is greater than the test value of the horizontal threshold is considered to be predicted compressible and a training data block having a CV*NZ product that is less than the test value of the horizontal threshold is considered to be predicted non-compressible;
    wherein the ROC tabulator tabulates a ROC curve wherein each point on the ROC curve is for a different one of the test values of the horizontal threshold, wherein the ROC tabulator tabulates true positives for predicted non-compressible training data blocks that are considered non-compressible, true negatives for predicted compressible training data blocks that are considered compressible, false positives for predicted compressible training data blocks that are considered non-compressible, and false negatives for predicted non-compressible training data blocks that are considered compressible;
    wherein the ROC tabulator tabulates a true positive rate as a function of a false positive rate for each of the plurality of test values of the horizontal threshold to determine points on the ROC curve;
    wherein the true positive rate is calculated by dividing the true positives by a sum of the true positives and the false negatives;
    wherein the false positive rate is calculated by dividing the false positives by a sum of the false positives and the true negatives.

7. The data-compression analyzer of claim 6 wherein the ROC optimizer selects an optimal point on the ROC curve and outputs the test value of the horizontal threshold corresponding to the optimal point as the horizontal threshold for use by the comparator for input data blocks.

8. The data-compression analyzer of claim 7 wherein the ROC optimizer calculates a plurality of Youden indexes, wherein each Youden index corresponds to a point on the ROC curve, the ROC optimizer selecting a Youden index having a maximum value to identify the optimal point.

9. The data-compression analyzer of claim 1 further comprising;
   a sorter for sorting the symbol frequency table based on the symbol value to generated a sorted symbol frequency table;
   a clipper for discarding entries in the sorted symbol frequency table having symbol values below a cutoff value to generate a clipped sorted symbol frequency table having fewer entries than the sorted symbol frequency table;
   a neural network that receives the clipped sorted symbol frequency table as an input and generates a predicted compression ratio for the input data block.

10. The data-compression analyzer of claim 9 wherein a compression ratio is received or generated for each training data block in the plurality of training data blocks, the compression ratio for a training data block being a ratio of a size of the training data block after compression to a size of the training data block;
    a neural network trainer that trains the neural network using the plurality of training data blocks that are processed by the counter, sorter, and clipper and input to the neural network, wherein weights of the neural network are adjusted to converge the predicted compression ratio to the compression ratio for each training data block during training,
    whereby the neural network is trained by the plurality of training data blocks to converge the predicted compression ratio to the compression ratio for each training data block during training.

11. A computer-implemented method for managing compression comprising:
    receiving an input data block and storing at least a portion of the input data block on a computer memory device;
    generating a symbol frequency table by counting occurrences of symbols in an input data block to generate symbol frequencies stored in a symbol frequency table in the computer memory device;
    calculating a Concentration Value (CV) of the input data block by summing squares of the symbol frequencies read from the symbol frequency table;
    wherein the symbol frequency table includes a zero entry for a zero-valued symbol, the symbol frequency for the zero entry being a Number of Zeros (NZ) that indicates a number of symbols in the input data block having the zero-valued symbol;
    using a computer to multiply the Concentration Value (CV) with the Number of Zeros (NZ) to get a CV*NZ product; and
    comparing the CV*NZ product to a horizontal threshold and signaling that the input data block is compressible when the CV*NZ product exceeds the horizontal threshold, and signaling that the input data block is not compressible when the CV*NZ product is less than the horizontal threshold,
    whereby the computer compares the CV*NZ product to the horizontal threshold to signal that the input data block is compressible or is not compressible.

12. The computer-implemented method of claim 11 further comprising during training:
    processing a plurality of training data blocks each having a compression ratio, the computer generating CV*NZ products for each block in the plurality of training data blocks;
    generating a first table of the CV*NZ products as a function of the compression ratio;
    wherein a vertical threshold indicates a threshold compression ratio, wherein a block with a compression ratio greater than the threshold compression ratio is classified as an actual compressible block, and a block with a compression ratio less than the threshold compression ratio is classified as an actual non-compressible block;
    setting a horizontal threshold to a plurality of test values, wherein a block with a CV*NZ product greater than the horizontal threshold is a predicted compressible block, and a block with a CV*NZ product less than the horizontal threshold is a predicted non-compressible block;
    generating a second table of true prediction rates and false prediction rates, wherein each entry in the second table has a true prediction rate and a false prediction rate and a test value of the horizontal threshold that generated the true prediction rate and the false prediction rate in the entry;
    wherein the true prediction rates and false prediction rates are a function of at least two of:
    a number of the predicted compressible blocks,
    a number of the predicted non-compressible blocks,
    a number of the actual compressible blocks, and
    a number of the actual non-compressible blocks;
    that are determined by the plurality of test values of the horizontal threshold;
    generating a Youden index for each entry in the second table;
    selecting as a selected entry an entry in the second table having a Youden index that is larger than Youden indexes for other entries in the second table; and
    outputting the horizontal threshold from the selected entry.

* * * * *